United States Patent
Tomikawa et al.

Patent Number: 5,298,461
Date of Patent: Mar. 29, 1994

[54] METHOD OF FORMING OHMIC CONTACT ELECTRODES FOR N-TYPE SEMICONDUCTOR CUBIC BORON NITRIDE

[75] Inventors: Tadashi Tomikawa; Tunenobu Kimoto; Nobuhiko Fujita, all of Hyogo, Japan

[73] Assignee: Sumitomo Electric Industries, Ltd., Osaka, Japan

[21] Appl. No.: 734,561

[22] Filed: Jul. 23, 1991

Related U.S. Application Data

[62] Division of Ser. No. 705,594, May 24, 1991.

[30] Foreign Application Priority Data

May 24, 1990 [JP] Japan ................... 2-134720
May 24, 1990 [JP] Japan ................... 2-134721
May 24, 1990 [JP] Japan ................... 2-134722
May 24, 1990 [JP] Japan ................... 2-134723

[51] Int. Cl.$^5$ ............................................ H01L 21/441
[52] U.S. Cl. ..................... 437/184; 437/189; 437/247; 257/741
[58] Field of Search ............ 437/184, 192, 189, 194, 437/247; 148/DIG. 113

[56] References Cited

U.S. PATENT DOCUMENTS 5,057,454 10/1991 Yoshida et al. ............... 437/192 X
5,187,560 2/1993 Yoshida et al. ............... 437/184 X

*Primary Examiner*—John S. Maples
*Attorney, Agent, or Firm*—Cushman, Darby & Cushman

[57] ABSTRACT

An ohmic contact electrode is formed on an n-type semiconductor cubic boron nitride by using a IVB metal; an alloy with a IVB metal; a metal with Si or S; an alloy with Si or S; a metal with B, Al, Ga, or In; an alloy with B, Al, Ga, or In; a VB metal; or an alloy with a VB metal.

4 Claims, 2 Drawing Sheets

METHOD OF FORMING OHMIC CONTACT ELECTRODES FOR N-TYPE SEMICONDUCTOR CUBIC BORON NITRIDE

This is a division of application Ser. No. 07/705,594, filed May 24, 1991 pending.

BACKGROUND OF THE INVENTION

1. Field of Invention

The present invention relates to an ohmic contact electrode for an n-type semiconductor cubic boron nitride.

2. Description of Related Art

Attention has been given to a semiconductor cubic boron nitride as a new material for semiconductor devices such as diodes, transistors, sensors, and so on. Although an insulating cubic boron nitride is known broadly, that which is discussed here is a semiconductor cubic boron nitride having low resistivity.

A cubic boron nitride has a wide forbidden band width (7.0 eV) and a high heat-proof temperature (1300° C.), and is chemically stable. Consequently, a semiconductor cubic boron nitride has been strongly expected to be an excellent material for environment-proof power devices, and blue light emission elements.

A cubic boron nitride does not naturally exist but can be formed through high-pressure synthesis. Further, recently, the formation of thin film through vapor phase synthesis has been reported.

A p-type cubic boron nitride can be obtained by doping beryllium (Be).

An n-type cubic boron nitride, on the other hand, can be obtained by doping sulfur (S) or silicon (Si). At present, a pn-junction diode is produced for trial by using a high-pressure synthetic method in such a manner that an n-type cubic boron nitride is continuously grown with a p-type cubic boron nitride as a seed crystal. The pn-junction diode which is produced has a diode characteristic under 650° C. Further, it has been reported that a pn-junction diode emits, by injection of minority carries, light from ultraviolet to blue centering around 340 nm.

A contact between a metal and a semiconductor is either a Schottky contact or an ohmic contact. The Schottky contact has a rectification property so that a current does not flow in a reverse direction. In the case of producing semiconductor devices, it is very important to form electrodes which can be formed by ohmic contact. The term "ohmic contact electrode" means an electrode in which the characteristic of a current flowing through the electrode and the characteristic of a voltage across the electrode are symmetrical forward and backward in accordance with the Ohm's law. Further, it is preferable that the contact resistance is reduced as much as possible. The term "contact resistance" is defined as a voltage to be applied so as to make a unit current flow through a unit contact surface. The unit of the contact resistance is $\Omega.cm^2$.

There has not yet been found a superior electrode for an n-type cubic boron nitride. Although silver (Ag), silver paste, or the like is used as an electrode for an n-type cubic boron nitride ((1) R.H.Wentorf, Jr.: J. of Chem. Phys. Vol. 36 (1962) 1990; (2) O. Mishima, etc.: Science Vol. 238 (1987) 181), there has been no report that an ohmic contact could be obtained.

The technique for forming ohmic contact is necessary and indispensable to produce semiconductor devices. Further, if an ohmic contact is obtained, it is desirable that the contact resistance in the ohmic contact portion be reduced as much as possible. The contact resistance of general electron devices is $10^{-2} \Omega.cm^2$ or less, and a smaller contact resistance of $10^{-4} \Omega.cm^2$ or less is required in high-speed and high-frequency devices.

If a formed contact is not an ohmic one but a Schottky one, carriers cannot be effectively injected into a produced device because of the existence of a Schottky barrier in the contact electrode portion even when the current is to be made to flow in the device. This results in low efficiency of carrier injection. Further, the voltage drop across the contact electrode portion is remarkably large because the resistance is larger at the contact electrode portion. Therefore, the effective voltage applied to the device ends up being small. As a result, the particularly desireable characteristics discussed above for the device cannot be obtained. Further, the generation of heat in the contact electrode portion is a large problem.

Accordingly, the formation of an ohmic contact electrode is necessary and indispensable in order to make it possible to utilize a semiconductor cubic boron nitride as a material for semiconductor devices.

An object of the present invention is therefore to form an ohmic contact electrode on an n-type semiconductor cubic boron nitride.

SUMMARY OF THE INVENTION

The ohmic contact electrode for an n-type semiconductor cubic boron nitride according to the present invention is an electrode formed on an n-type semiconductor cubic boron nitride so that an ohmic contact electrode can be obtained by using:

(1) a IVB family metal which includes titanium (Ti), zirconium (Zr), and hafnium (Hf) or an alloy containing a IVB family metal;

(2) a metal or alloy containing silicon (Si) or sulfur (S);

(3) a metal or alloy containing at least one of boron (B), aluminum (Al), gallium (Ga), and indium (In); or (4) a Group VB family metal which includes vanadium (V), niobium (Nb), and tantalum (Ta) or an alloy containing a Group VB family metal.

(1) IVB family metal or an alloy containing a IVB family metal;

(2) a metal or alloy containing Si or S;

(3) a metal or alloy containing at least one of B, Al, Ga and In; or (4) a Group VB family metal or an alloy containing a Group VB family metal.

Figure 2:
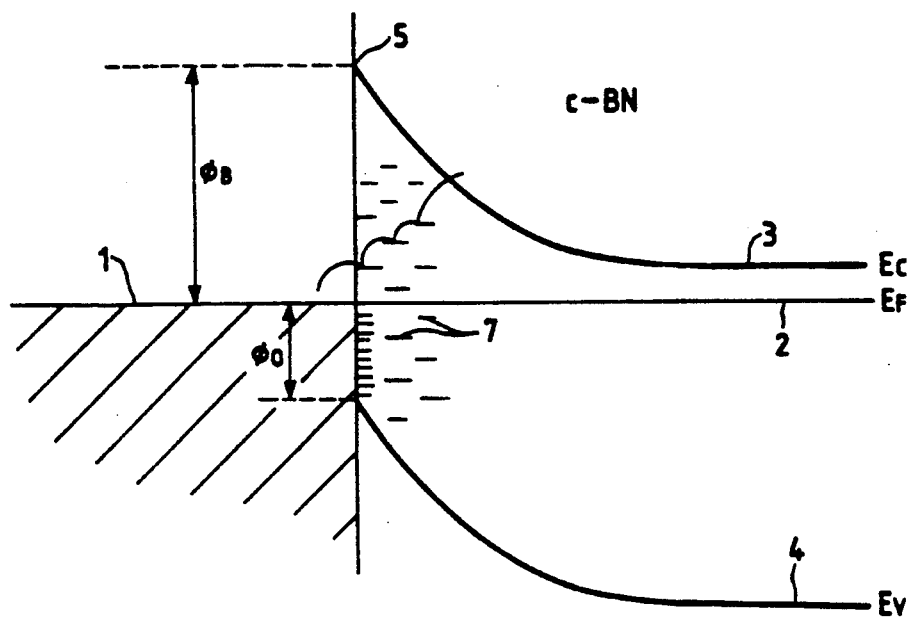

FIG. 2 is a band diagram in the case where high-density localized states are formed in the vicinity of a metal/semiconductor interface when one of the following materials is applied to an n-type semiconductor cubic boron nitride:

(1) a IVB family metal or an alloy containing a IVB family metal;

(2) a metal or alloy containing at least one of B, Al, Ga and In; or (3) a VB family metal or an alloy containing a VB family metal.

Figure 3:
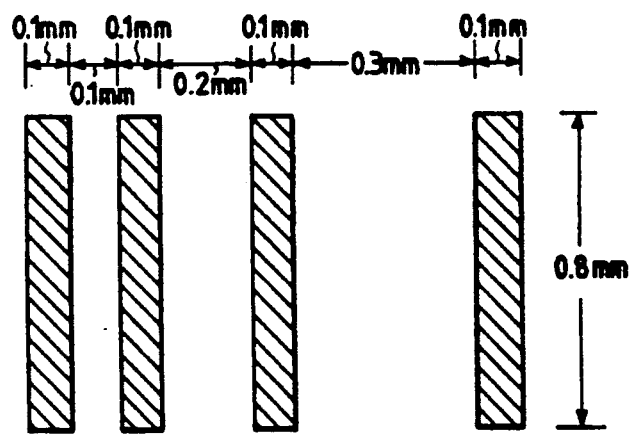

FIG. 3 is a plan showing an electrode pattern which was used in measuring the contact resistance between the semiconductor cubic boron nitride and the electrodes. In the drawing, hatched portions represent the electrodes:

1 ... Fermi-level of electrode;
2 ... Fermi-level of semiconductor;
3 ... lower end of conduction band of semiconductor;
4 ... upper end of valence band of semiconductor;
5 ... electrode/semiconductor interface.

DETAILED DESCRIPTION OF THE PREFERRED EMBODIMENTS

According to the present invention, an ohmic contact electrode can be obtained by coating an n-type cubic boron nitride with the following:

(1) A IVB family metal (Ti, Zr, or Hf) or an alloy containing a IVB family metal;

(2) A metal or alloy containing Si or S which is contained in a matrix material desirably selected from Cr, W, Mn, Co, Ni, Pt, Ag, Zn, WC, MnZn, Ni B, PtPd, AgAl, and so on;

(3) A metal or alloy containing at least one of B, Al, Ga and In; or (4) A VB family metal (V, Nb, or Ta) or an alloy containing a VB family metal.

This technique has been found through repeated experiments. Although the reason is unclear why an ohmic contact is obtained by using the above mentioned metals or alloys, some possibilities can be considered.

IVB Family Elements

When a IVB family metal such as Ti, Zr, Hf, TiC, ZrNi, or the like, or an alloy containing a IVB family metal is formed as an electrode on an n-type cubic boron nitride, the electrode constituent element/elements as well as boron and nitrogen are activated by the heating of a substrate at the time of electrode formation, radiation heat at the time of electrode evaporation, annealing after the electrode formation, etc., so that mutual diffusion is generated in an interface between the electrode and the semiconductor.

The IVB family elements (Ti, Zr, and Hf), on the other hand, are also apt to react with boron and nitrogen so as to easily form a boride such as $TiB_2$, $ZrB_2$, $HfB_2$, etc. and a nitride such as TiN, ZrN, HfN, etc. This phenomenon is well known. Therefore, the mutual diffusion in the electrode constituent elements as well as boron and nitrogen is further accelerated. Moreover, a metal compound layer is formed in the electrode/semiconductor interface in which the mutual diffusion is generated, and the substantial electrode/semiconductor interface is shifted into a semiconductor layer so as to form a clean interface.

Further, there is a possibility that the IVB family elements (Ti, Zr, and Hf) diffused into the cubic boron nitride become donors for the cubic boron nitride. There is a further possibility that holes or defects formed at places where boron and nitrogen have been removed by the diffusion become donors. As a result, an n-layer (n+ layer) doped with high concentration is formed in the region where the mutual diffusion has been generated. Although the cubic boron nitride is of the n-type originally, it becomes of the n-type having a doping concentration considerably higher than the original mean doping concentration. The thickness of the barrier layer is reduced by the hi9h-concentration doping so that the contact becomes ohmic by a tunneling current.

Si or S

Similarly, when a metal or alloy containing Si or S is formed as an electrode on an n-type cubic boron nitride, the Si or S contained in the electrode is activated by heating of a substrate at the time of electrode formation, radiation heat at the time of electrode evaporation, annealing after the electrode formation, etc., so that the Si or S gradually diffuses into the adjacent cubic boron nitride.

The Si or S acts as an effective donor in the cubic boron nitride. This phenomenon is well known. Therefore, in the region where Si or S has been diffused, an n-layer (n.-layer) doped with high concentration is formed.

B, Al, Ga, or In

Similarly when a metal or alloy consisting of at least one of B, Al, Ga and In is formed as an electrode on an n-type cubic boron nitride, an electrode constituent element/elements as well as boron and nitrogen are activated by heating of a substrate at the time of electrode formation, radiation heat at the time of electrode evaporation, annealing after the electrode formation, etc., so that mutual diffusion is generated in an interface between the electrode and the semiconductor.

Such elements as Al, Ga, In, etc. easily react with nitrogen so as to easily form nitride such as AlN, GaN, InN, etc. This phenomenon is well known. Also in the case where an electrode includes B, of course, nitrogen diffuses into B. Further, Al easily forms boride such as $AlB_2$, etc. This is well known. Therefore, the mutual diffusion in the electrode constituent elements as well as boron and nitrogen is further accelerated. Moreover, a metal compound layer is formed in the electrode/semiconductor interface in which the mutual diffusion is generated, and the substantial electrode/semiconductor interface is shifted into a semiconductor layer so as to form a clean interface.

Group VB Family Metal

Similarly, when a VB family metal such as V, Nb, Ta, VC, $Nb_3Al$, or the like, or an alloy containing a Group VB family metal is formed as an electrode on an n-type cubic boron nitride, an electrode constituent element/elements as well as boron and nitrogen are activated by heating of a substrate at the time of electrode formation, radiation heat at the time of electrode evaporation, annealing after the electrode formation, etc., so that mutual diffusion is generated in an interface between the electrode and the semiconductor.

The Group VB family elements (V, Nb, and Ta) are also apt to react with boron and nitrogen so as to easily form a boride such as $VB_2$, $NbB_2$, $TaB_2$, etc. and a nitride such as VN, NbN, TaN, etc. This phenomenon is well known. Therefore, the mutual diffusion in the electrode constituent elements as well as B and N is further accelerated. Moreover, a metal compound layer is formed in the electrode/semiconductor interface in which the mutual diffusion is generated, and the substantial electrode/semiconductor interface is shifted into a semiconductor layer so as to form a clean interface.

Presently for all four types of coatings, there is the possibility that holes or defects formed at places where boron or nitrogen have been removed by the diffusion thereof into the electrode act as donors. In fact, in the case of GaN which is a III-V family compound and which is of the same kind as boron nitride, extreme n-type semiconductor characteristics are shown without any doping. This is, perhaps, because holes at which nitrogen has been removed act as donors.

As a result of mutual diffusion, an n-layer (n⁻-layer) in which high concentration donor is formed in the region in the vicinity of the interface between the electrode and the cubic boron nitride. Although the cubic boron nitride is of the n-type originally, it becomes of the n-type having a donor concentration considerably higher than the original mean donor concentration. The thickness of the barrier layer is reduced by the high-concentration donor so that the contact becomes ohmic by a tunneling current.

In an ideal case, whether a metal/semiconductor contact becomes an ohmic one or a Schottky one is determined depending on the work function ($\phi_m$) of the metal and the electron affinity ($X_s$) of the semiconductor. Here, the work function of a metal is energy required for drawing out electrons in Fermi-level to an infinite distance. The electron affinity of a semiconductor is energy required for drawing out electrons existing in the bottom of a conduction band to an infinite distance. In the case of an n-type semiconductor, the height ($100_B$) of a barrier in a metal/semiconductor contact is expressed by the following equation.

$$\phi_B = \phi_m - X_s \quad (1)$$

The contact becomes therefore:

an ohmic one when $\phi_B < 0$; and a Schottky one when $\phi_B > 0$.

Since $\phi_B$ represents the height of the barrier, electrons are checked by the barrier if the value of $\phi_B$ is positive so that the contact becomes a Schottky one, while if the value of $\phi_B$ is negative, there is no barrier so that the contact becomes an ohmic one. It seems, from the above equation, that an ohmic contact can be obtained if a metal having a low work function is selected to be an electrode.

In an actual metal/semiconductor contact, however, defects exist in a metal/semiconductor contact interface so as to form localized states (also called interface states, $\phi_O$: interface level) in the vicinity of the center in a band gap. If a large number of defects exist, the Fermi-level of the semiconductor is pinned up to the level of $\phi_O$. As a result, if the band gap of the semiconductor is represented by $E_E$, $\phi_B$ is expressed by the following equation, and hardly depends on the kind of metal at all.

$$\phi_B = E_E - \phi_O \quad (2)$$

The $\phi$ is measured from the upper end of the valence band. This is because electrons from the metal can freely flow into the localized states to occupy the states so that the upper end of the localized states coincides with the Fermi plane of the metal and the Fermi level of the semiconductor coincides with the Fermi plane of the metal.

Since it is the case, of course, that $\phi_B > 0$, the metal/semiconductor contact becomes a Schottky one. This phenomenon is known as the pinning effect, and is remarkable particularly in the case of III-V family compound semiconductors. Further, $\phi_O$ is about ⅓-½ times as large as $E_g$.

Also in the case of a cubic boron nitride, various kinds of interface defects may exist because it is not a single element material. Further, it is thought that a large number of interface defects exist which thereby cause the pinning effect because a cubic boron nitride crystal in the present circumstances is imperfect and has a large number of defects.

Figure 1:
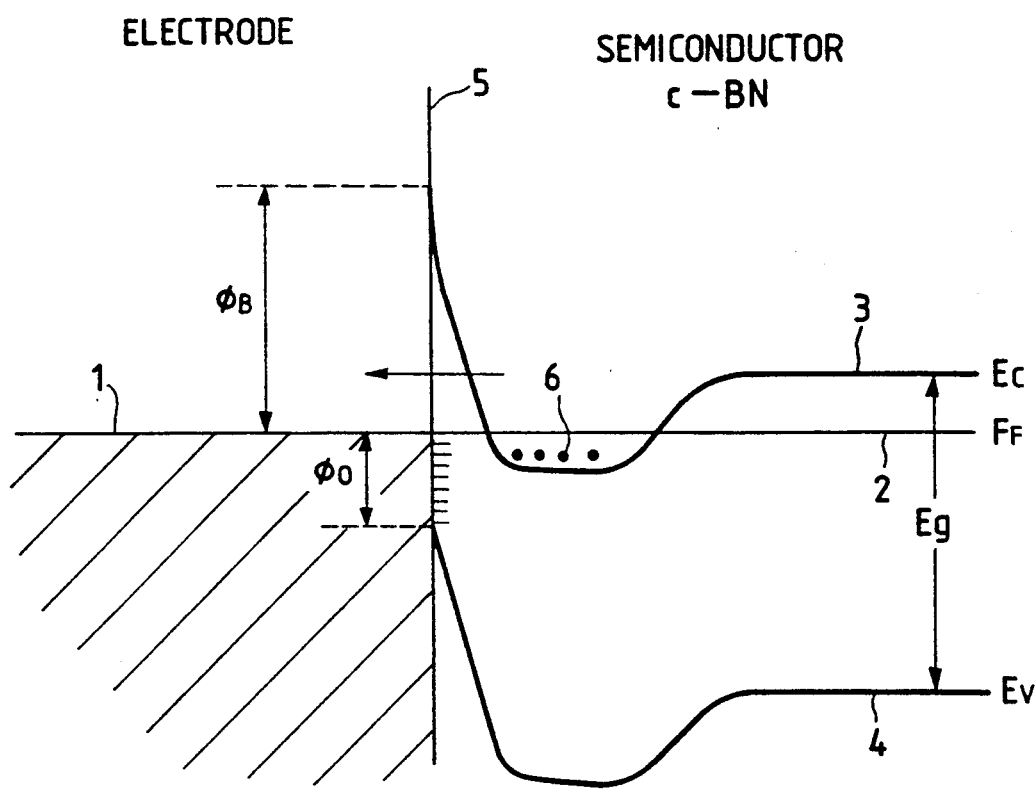
FIG. 1 is a band diagram in the case where a high concentration doped layer is formed in the vicinity of a metal/semiconductor interface when one of the following materials is applied to an n-type semiconductor cubic boron nitride.

FIG. 1 is a band diagram of a Schottky contact between a metal and an n-type semiconductor. A Fermi-level 2 of the semiconductor is continued from a Fermi-level 1 of the outside metal. A conduction band and a valence band exist in the semiconductor. The reference numerals 3 and 4 designate the lower end of the conduction band and the upper end of the balance band respectively. Since the semiconductor is of the n-type, the lower end 3 of the conduction band is approximate to the Fermi-level 2. The Fermi-level is pinned up to the interface level $\phi_O$ at a boundary 5, so that a barrier having a height of $\phi_B$ is formed. The band is extremely bent upward in the vicinity of the boundary 5 because the donor density is high at the boundary. Although electrons accumulate in a downward curved portion 6 in the conduction band, the electrons may fly into the metal because of the tunneling effect. Since all the donor at the metal/semiconductor boundary are donated electrons and have positive charges of e. The positive charges are substantially uniformly distributed in the vicinity of the boundary and therefore this portion becomes a depletion layer in which no electron exists. The thickness of this portion can be calculated as follows. The following equation is established by integrating the Gaussian expression relating to an electric field and electric charges.

$$d = [2 \cdot \epsilon_S \cdot \epsilon_O \cdot (\phi_B - V)/(e \cdot N_d)]^{\frac{1}{2}} \quad (3)$$

d: depletion layer width
$\epsilon_S$: specific inductive capacity of the semiconductor
$\epsilon_O$: specific inductive capacity of the semiconductor
V: applied voltage
e: elementary electric charge
$N_d$: donor density in the semiconductor Although $\phi_B$ is a potential having an energy dimension as before, $\phi_B$ is treated below as a value of voltage obtained by dividing the potential by the elementary electric charge e.

As seen from the equation (3), the depletion layer width d becomes smaller as the donor density in the semiconductor becomes higher. Since electrons easily pass through the thin depletion layer, the contact comes to have low resistance. This phenomenon will be described in more detail.

Being a tunneling current, a current I per unit area can be expressed as follows.

$$I = AT^2 \exp \{-2\int_0^d (8 \pi^2 m_e U/h^2)^{\frac{1}{2}} dx\} \quad (4)$$

in which U represents the potential of a conduction electron measured from the bottom of the conduction band.

U is expressed as follows as a function of x by integrating the Gaussian expression.

$$U = e(\phi_B - V)\{1-(x/d)\}^2 \quad (5)$$

$$A = 4 \pi e m_e k^2 /h^3 \quad (6)$$

in which, me represents the effective mass of electrons in the semiconductor, h represents the Planck's constant, k represents the Boltzmann constant, and T represents the absolute temperature. In the case of free electrons, A is 120 A/cm²K². If integration is made with respect to x, the following expression is obtained.

$$I = AT^2 \exp\{-(\phi_B - V)/V_{OO}\} \quad (7)$$

in which $$V_{OO} = hNd^{\frac{1}{2}}/4\pi (\epsilon_O \epsilon_S m_e)^{\frac{1}{2}} \quad (8)$$

Assuming that $Nd = 10^{21} cm^{-3}$, me represents the free electron mass, and $\epsilon_S = 1$, $\epsilon_O = 1$, and $T = 300°$ K., then $V_{OO}$ is 0 56 V. Although the definition of $\phi_B$ has been described above, it is considered that if an n-type impurity is doped with high concentration, the $\phi_B$ itself decreases. This is because, as the localized states increase, $\phi_O$ increases. $E_g$ is 7 eV, while $\phi_B$ decreases to about 6-3 V. It is assumed that the concentration of doping is extremely large in the vicinity of the boundary. If $V_{OO} = 0.5$ V, this contact can be regarded substantially as an ohmic one from the equation (6). This is the case provided that the direction of the voltage from the semiconductor side toward the metal electrode is defined to be positive.

Resistance ($R_C$) is obtained by partially differentiating the current with respect to the voltage on the assumption that $V = 0$.

The $R_C$ at this time is expressed by the following equation.

$$R_C = (V_{OO}/AT^2)\exp(\phi_B/V_{OO}) \quad (9)$$

Assuming that $Nd = 10^{21} cm^{-3}$, the mass of free electrons is represented by me, $\epsilon_O = 1$, and $T = 300°$ K., then $V_{OO} = 0.56$ V. If the coefficient before exp. is included in exp., the following equation is obtained.

$$R_c = \exp\{(\phi_B/0.56) - 16.77\} \quad (10)$$

If $\phi_B = 6$ V, Rc becomes $10^{-3}$ Ω.cm², while if $\phi_B = 7$ V, Rc becomes $10^{-2}$ Ω.cm².

Assuming that $Nd = 10^{20} cm^{-3}$, then $V_{OO}$ becomes 0.18 V and the following equation is obtained.

$$R_C = \exp\{(\phi_B/0.18) - 17.91\} \quad (11)$$

If $\phi_B = 3V$, $R_c$ is about $10^{-1}$ Ω.cm², while if $\Omega_B = 2.5V$, Rc is about $10^{-2}$ Ω.cm².

Thus, if an n-type impurity is doped with high concentration, the depletion layer thickness d decreases. Further, there is such an effect that the localized state of the surface is increased by high concentration doping so that $\phi_O$ increases and $\phi_B$ decreases. Although description has been made as to the case where $\phi_B$ is about $\frac{1}{2}$-$\frac{3}{4}$ times as large as the band gap (7eV), it is considered that the $\phi_B$ may be further reduced.

Thus, the higher the donor density is made by high concentration doping, the more the thickness of the depletion layer decreases and the more $\phi_B$ decreases so as to make a tunneling current flow easily. Thus, it can be expected that the contact becomes ohmic. But the fact is not yet clearly understood. It may be that the localized state is transmitted by the tunnelling of electrons. Although such an effect can be expected by doping an impurity with high concentration, if the density of the impurity becomes so high, the result is rather undesirable because the resistance of the electrode increases. It is therefore believed that there exists a suitable range of the concentration.

Further, the following possibility is considered. That is, a boride layer and a nitride layer have been formed in a metal/semiconductor interface so that a large number of defects have been brought into the interface and the vicinity of the interface. If the localized states 7 of high density exist in the vicinity of the boundary 5 as shown in FIG. 2, electrons may move between the metal and the semiconductor through the states so that a current may flow between them. Since the higher the localized state density is, the more easily electrons move, which makes the contact resistance become low. Moreover, since the movement is performed bi-directionally, the contact becomes ohmic.

Other than those mechanisms described above, various mechanisms for obtaining an ohmic contact can be considered. They cannot be specified at the present time. An ohmic contact, however, can be obtained on an n-type cubic boron by forming an electrode according to the present invention.

EXAMPLES

The ohmic contact electrode according to the present invention will be described more in detail with reference to examples.

In order to inspect the kind of electrode material to which the electrode structure of the present invention was suitable, electrodes were produced from various materials and the ohmic property and contact resistance were evaluated.

EXAMPLE 1

Ti, TiAl, TiB₂, TiC, TiCr, TiFe, TiN, TiNb, TiNi, TiSi, Zr, ZrAl, ZrB, ZrC, ZrN, ZrNb, ZrNi, ZrS₂, ZrSi₂, Hf, HfB₂, HfC, HfN, HfS₂, and HfSi₂ were formed, as the electrodes, according to the present invention, on a high-pressure synthesized Si-doped n-type cubic boron nitride, and the ohmic property and contact resistance of the thus formed electrodes were evaluated. The electrodes were formed at a substrate temperature of 400° C by vacuum evaporation or sputtering depending on the material.

At that time, an electrode pattern shown in FIG. 3 was formed on the cubic boron nitride by using a metal mask. The thickness of each of four electrodes was about 0.2–0.3 μm. The length was 0.8 mm and the width was 0.1 mm. They were arranged in parallel to each other at intervals of 0.1 mm, 0.2 mm, and 0.3 mm.

The current-voltage characteristic between arbitrary electrodes was measured in a voltage range of from −10V to +10V to thereby judge the ohmic property of the electrodes. With respect to the electrodes of which the ohmic characteristic has been measured, the contact resistance was measured by using a transmission line model on the basis of the resistance and electrode distance between two electrodes of the electrode pattern of FIG. 3.

Table 1 shows the summary of the results of applying one of the above metals to form an ohmic contact electrode.

TABLE 1

Electrodes Containing Group IVB-Family Metal, Current-Voltage Characteristic, and Contact Resistance

| Electrode (atom ratio) | Method of Formation | Current-voltage Characteristics | Contact Resistance ($\Omega \cdot cm^2$) |
|---|---|---|---|
| Ti | Vacuum evap. | Ohmic | $2 \times 10^{-1}$ |
| TiAl | Sputtering | Ohmic | $3 \times 10^{-1}$ |
| TiB$_2$ | Sputtering | Ohmic | $8 \times 10^{-2}$ |
| TiC | Sputtering | Ohmic | $1 \times 10^{-1}$ |
| TiCr(80:20) | Sputtering | Ohmic | $5 \times 10^{-1}$ |
| TiFe | Sputtering | Ohmic | $4 \times 10^{-1}$ |
| TiN | Sputtering | Ohmic | $7 \times 10^{-2}$ |
| TiNb(66:34) | Sputtering | Ohmic | $3 \times 10^{-1}$ |
| TiNi(55:45) | Sputtering | Ohmic | $7 \times 10^{-1}$ |
| TiSi$_2$ | Sputtering | Ohmic | $4 \times 10^{-2}$ |
| Zr | Vacuum evap. | Ohmic | $1 \times 10^{-1}$ |
| ZrAl(75:25) | Sputtering | Ohmic | $3 \times 10^{-1}$ |
| ZrB$_2$ | Sputtering | Ohmic | $7 \times 10^{-2}$ |
| ZrC | Sputtering | Ohmic | $9 \times 20^{-2}$ |
| ZrN | Sputtering | Ohmic | $6 \times 10^{-2}$ |
| ZrNb(95:5) | Sputtering | Ohmic | $5 \times 10^{-1}$ |
| ZrNi | Sputtering | Ohmic | $6 \times 10^{-1}$ |
| ZrS$_2$ | Sputtering | Ohmic | $4 \times 10^{-2}$ |
| ZrSi$_2$ | Sputtering | Ohmic | $5 \times 10^{-2}$ |
| Hf | Vacuum evap. | Ohmic | $8 \times 10^{-2}$ |
| HfB$_2$ | Sputtering | Ohmic | $6 \times 10^{-2}$ |
| HfC | Sputtering | Ohmic | $2 \times 10^{-1}$ |
| HfN | Sputtering | Ohmic | $9 \times 10^{-2}$ |
| HfS$_2$ | Sputtering | Ohmic | $6 \times 10^{-2}$ |
| HfSi$_2$ | Sputtering | Ohmic | $4 \times 10^{-2}$ |

As seen in Table 1, Group IVB family metals such as Ti, Zr, Hf, TiC, ZrNi, etc. and alloys containing Group IVB family metal were formed, as the electrodes, on an n-type cubic boron nitride, so that the ohmic characteristic could be obtained although the contact resistance was a value within a range from $10^{-2}$ to $10^{-1}$ $\Omega \cdot cm^2$.

EXAMPLE 2

Si or S was added to Cr, W, Mn, Co, Ni, Pt, Ag, Zn, WC, MnZn, Ni$_2$B, PtPd, or AgAl. As the cubic boron nitride, a high-pressure composition was used. The electrodes were formed at a substrate temperature of 400° C, and by the use of vacuum evaporation or sputtering depending on the material. As the electrode materials, used were those in which each of the Si-concentration and S-concentration was 0.1%–0.5%.

At that time, an electrode pattern shown in FIG. 3 was formed on the cubic boron nitride by using a metal mask. The thickness of each of four electrodes was about 0.5–0.3 μm. The length was 0.8 mm and the width was 0.1 mm. They were arranged in parallel to each other at intervals of 0.1 mm, 0.2 mm, and 0.3 mm. The current-voltage characteristic between arbitrary electrodes was measured in a voltage range of from −10 V to +10 V to thereby judge the ohmic property of the electrodes. With respect to the electrodes the ohmic characteristic of which has been measured, the contact resistance was measured by using a transmission line model on the basis of the resistance and electrode distance between two electrodes of the electrode pattern of FIG. 3.

The results of the above examples in which either Si or S were added with the above metals to form electrodes are summarized in Tables 2 and 3

TABLE 2

Electrodes Containing Si, Current-Voltage Characteristic, and Contact Resistance

| Electrode | Method of Formation | Current-voltage Characteristic | Contact Resistance ($\Omega \cdot cm^2$) |
|---|---|---|---|
| CrSi | Vacuum evap. | Ohmic | $1 \times 10^{-1}$ |
| WSi | Vacuum evap. | Ohmic | $4 \times 10^{-2}$ |
| MnSi | Vacuum evap. | Ohmic | $2 \times 10^{-1}$ |
| CoSi | Vacuum evap. | Ohmic | $6 \times 10^{-2}$ |
| NiSi | Vacuum evap. | Ohmic | $6 \times 10^{-2}$ |
| PtSi | Vacuum evap. | Ohmic | $7 \times 10^{-2}$ |
| AgSi | Vacuum evap. | Ohmic | $8 \times 10^{-2}$ |
| ZnSi | Vacuum evap. | Ohmic | $5 \times 10^{-2}$ |
| WCSi | Sputtering | Ohmic | $2 \times 10^{-2}$ |
| MnZnSi | Sputtering | Ohmic | $9 \times 10^{-2}$ |
| Ni$_2$BSi | Sputtering | Ohmic | $8 \times 10^{-2}$ |
| PtPdSi | Sputtering | Ohmic | $2 \times 10^{-1}$ |
| AgAlSi | Sputtering | Ohmic | $9 \times 10^{-2}$ |

(Here, MSi does not means that the element ratio of a metal or an alloy M to Si is 1:1 but means that a certain quantity of Si is contained in the metal or alloy M. That is, MSi does not means a molecular formula with respect to Si.)

TABLE 3

Electrodes Containing S, Current-Voltage Characteristic, and Contact Resistance

| Electrode | Method of Formation | Current-voltage Characteristic | Contact Resistance ($\Omega \cdot cm^2$) |
|---|---|---|---|
| CrS | Vacuum evap. | Ohmic | $2 \times 10^{-1}$ |
| WS | Vacuum evap. | Ohmic | $2 \times 10^{-2}$ |
| MnS | Vacuum evap. | Ohmic | $9 \times 10^{-2}$ |
| CoS | Vacuum evap. | Ohmic | $7 \times 10^{-2}$ |
| NiS | Vacuum evap. | Ohmic | $1 \times 10^{-1}$ |
| PtS | Vacuum evap. | Ohmic | $8 \times 10^{-2}$ |
| AgS | Vacuum evap. | Ohmic | $6 \times 10^{-2}$ |
| ZnS | Vacuum evap. | Ohmic | $8 \times 10^{-2}$ |
| WCS | Sputtering | Ohmic | $2 \times 10^{-2}$ |
| MnZnS | Sputtering | Ohmic | $7 \times 10^{-2}$ |
| Ni$_2$BS | Sputtering | Ohmic | $6 \times 10^{-2}$ |
| PtPdS | Sputtering | Ohmic | $1 \times 10^{-1}$ |
| AgAlS | Sputtering | Ohmic | $8 \times 10^{-1}$ |

(Here, MS does not mean that the atom ratio of a metal or an alloy M to S is 1:1 but means that a certain quantity of S is contained in the metal or alloy M. That is, MS does not mean a molecular formula with respect to S.)

Inspection was made on various metal materials and metal compounds, and as seen in Tables 2 and 3, the ohmic characteristic could be obtained with respect to all the material, although the contact resistance was a value within a range from $10^{-2}$ to $10^{-1}$ $\Omega \cdot cm^2$.

This fact makes reasonable the aforementioned estimation of the electron tunnel effect due to high concentration donor generation at the boundary between a metal and a semiconductor.

EXAMPLE 3

When a metal or a metal compound containing Si or S is used as a material for the electrode, inspection was made to obtain a proper concentration of Si or S.

The electrodes were made from PtSi or PtS (this does not mean that the atomic ratio is 1:1 but means that a certain quantity of Si or S is contained in Pt) under the condition that the respective concentrations of Si and S were changed variously. The results of evaluation of the ohmic characteristic and contact resistance are shown in Tables 4 and 5.

As the cubic boron nitride, a high-pressure composition was used. The electrodes were formed through a vacuum evaporation method without heating the substrates and subjected to annealing in an atmosphere of $N_2 + H_2$ ($H_2$:10%) at 800° C. for 10 minutes.

TABLE 4

Si Concentration, Current-Voltage Characteristic, and Contact Resistance

| Si Concentration (PtSi) | Current-Voltage Characteristic | Contact Resistance ($\Omega \cdot cm^2$) |
|---|---|---|
| 0.01% | Ohmic | $2 \times 10^0$ |
| 0.1% | Ohmic | $1 \times 10^{-1}$ |
| 1.5% | Ohmic | $6 \times 10^{-2}$ |
| 1.0% | Ohmic | $5 \times 10^{-2}$ |
| 5.0% | Ohmic | $2 \times 10^{-1}$ |
| 10.0% | Ohmic | $3 \times 10^1$ |

TABLE 5

S Concentration, Current-Voltage Characteristic, and Contact Resistance

| S Concentration (PtS) | Current-Voltage Characteristic | Contact Resistance ($\Omega \cdot cm^2$) |
|---|---|---|
| 0.01% | Ohmic | $1 \times 10^0$ |
| 0.1% | Ohmic | $9 \times 10^{-2}$ |
| 0.5% | Ohmic | $4 \times 10^{-2}$ |
| 1.0% | Ohmic | $4 \times 10^{-2}$ |
| 5.0% | Ohmic | $1 \times 10^{-1}$ |
| 10.0% | Ohmic | $2 \times 10^{-1}$ |

From the Tables 4 and 5, it can be seen that the ohmic contact could be obtained over all the range of Si- or S-concentration, and that although the contact resistance decreased as the Si- or S-concentration increases, it reached the minimum at several % and then increased thereafter. Further, it is not desirable to make the Si- or Si concentration excessively high, because the resistance of the electrode per se becomes high. In practice, it suffices to select the Si- or S- concentration to be about 1 % by weight.

EXAMPLE 4

B, $AlB_2$, $CrB_2$, $SiB_4$, WB, Al, AlCu, AlSi, Ga, GaIn, GaSn, GaZn, In, InMg, and InSn were formed, as the electrodes, according to the present invention, on a high-pressure synthesized Si-doped n-type cubic boron nitride, and the ohmic property of the thus formed electrodes was evaluated. In the case of low melting point metals and alloys such as Ga, In, GaIn, etc., after electrode materials were set at two positions on a cubic boron nitride, electrodes were formed through alloying treatment in an $N_2$ atmosphere at 400° C. for five minutes. The current-voltage characteristic between those electrodes was measured in a voltage range of from $-10$ V to $+10$ V to thereby judge the ohmic property of the electrodes.

The other electrodes were formed by using a vacuum evaporation method or a sputtering method depending on the materials under the condition that the substrate temperature was kept at room temperature. After formation of the electrodes, annealing was made in an $N_2$ atmosphere at 400° C. for 20 minutes. Further, in formation of the electrodes, an electrode pattern shown in FIG. 3 was formed on the cubic boron nitride by using a metal mask. The thickness of each of four electrodes was about 0.2–0.3 $\mu$m. The length was 0.8 mm and the width was 0.1 mm. They were arranged in parallel to each other at intervals of 0.1 mm, 0.2 mm, and 0.3 mm.

With respect to the electrodes the ohmic characteristic of which has been measured, the contact resistance was measured by using a transmission line model on the basis of the resistance and electrode distance between two electrodes of the electrode pattern of FIG. 3.

Table 6 shows the summary of the results of the above examples.

TABLE 6

Electrodes Containing B, Al, Ga, or In; Current-Voltage Characteristic and Contact Resistance

| Electrode (atom ratio) | Method of Formation | Current-voltage Characteristic | Contact Resistance ($\Omega \cdot cm^2$) |
|---|---|---|---|
| B | Vacuum evap. | Ohmic | $4 \times 10^{-1}$ |
| $AlB_2$ | Sputtering | Ohmic | $9 \times 10^{-2}$ |
| $CrB_2$ | Sputtering | Ohmic | $4 \times 10^{-1}$ |
| $SiB_4$ | Sputtering | Ohmic | $5 \times 10^{-2}$ |
| WB | Sputtering | Ohmic | $3 \times 10^{-1}$ |
| Al | Vacuum evap. | Ohmic | $2 \times 10^{-1}$ |
| AlCu | Sputtering | Ohmic | $5 \times 10^{-1}$ |
| AlSi | Sputtering | Ohmic | $8 \times 10^{-2}$ |
| Ga | Alloying | Ohmic | — |
| GaIn | Alloying | Ohmic | — |
| GaSn | Alloying | Ohmic | — |
| GaZn | Sputtering | Ohmic | $6 \times 10^{-1}$ |
| In | Alloying | Ohmic | — |
| InMg | Sputtering | Ohmic | $7 \times 10^{-1}$ |
| InSn | Alloying | Ohmic | — |

As seen in Table 6, a metal or alloy consisting of at least one of the elements B, Al, Ga and In was formed, as an electrode, on an n-type cubic boron nitride, so that the ohmic characteristic could be obtained. The contact resistance of the electrode formed through vacuum evaporation or sputtering was within an order of $10^{-2}$–$10^{-1}$ $\Omega \cdot cm^2$.

EXAMPLE 5

V, $VB_2$, VC, $V_3Co$, $VaG_3$, VN, VS, $V_3Si$, $V_2Zr$, Nb, $Nb_3Al$, $NbB_2$, NbC, $Nb_3Ga$, $Nb_3Ge$, NbN, $NbS_2$, $NbSi_2$, Ta, $TaB_2$, TaC, TaN, $TaS_2$, and TaSi were formed, as the electrodes according to the present invention, on a high-pressure synthesized Si-doped n-type cubic boron nitride, and the ohmic property and contact resistance of the thus formed electrodes were evaluated. The electrodes were formed at a substrate temperature of 400° C. by vacuum evaporation or sputtering depending on the material.

At that time, an electrode pattern shown in FIG. 3 was formed on the cubic boron nitride by using a metal mask. The thickness of each of four electrodes was about 0.2–0.3 $\mu$m. The length was 0.8 mm and the width was 0.1 mm. They were arranged in parallel to each other at intervals of 0.1 mm, 0.2 mm, and 0.3 mm. The current-voltage characteristic between arbitrary electrodes was measured in a voltage range of from $-10$ V to $+10$ V to thereby judge the ohmic property of the electrodes. With respect to the electrodes the ohmic characteristic of which has been measured, the contact resistance was measured by using a transmission line model on the basis of the resistance and electrode distance between two electrodes of the electrode pattern of FIG. 3.

Table 7 shows the summary of the results of the above example.

TABLE 7

Electrodes Containing Group IVB-Family Metal, Current-Voltage Characteristic, and Contact Resistance

| Electrode (atom ratio) | Method of Formation | Current-voltage Characteristic | Contact Resistance ($\Omega \cdot cm^2$) |
|---|---|---|---|
| V | Vacuum evap. | Ohmic | $3 \times 10^{-1}$ |
| $VB_2$ | Sputtering | Ohmic | $9 \times 10^{-2}$ |
| VC | Sputtering | Ohmic | $1 \times 10^{-1}$ |
| $V_3Co$ | Sputtering | Ohmic | $7 \times 10^{-1}$ |
| $V_3Ga$ | Sputtering | Ohmic | $5 \times 10^{-1}$ |
| VN | Sputtering | Ohmic | $8 \times 10^{-2}$ |
| VS | Sputtering | Ohmic | $5 \times 10^{-2}$ |
| $V_3Si$ | Sputtering | Ohmic | $6 \times 10^{-2}$ |
| $V_2Zr$ | Sputtering | Ohmic | $2 \times 10^{-1}$ |
| Nb | Vacuum evap. | Ohmic | $3 \times 10^{-1}$ |
| $Nb_3Al$ | Sputtering | Ohmic | $5 \times 10^{-1}$ |
| $NbB_2$ | Sputtering | Ohmic | $8 \times 10^{-2}$ |
| NbC | Sputtering | Ohmic | $1 \times 10^{-1}$ |
| $Nb_3Ga$ | Sputtering | Ohmic | $5 \times 10^{-1}$ |
| $Nb_3Ge$ | Sputtering | Ohmic | $6 \times 10^{-1}$ |
| NbN | Sputtering | Ohmic | $9 \times 10^{-2}$ |
| $NbS_2$ | Sputtering | Ohmic | $5 \times 10^{-2}$ |
| $NbSi_2$ | Sputtering | Ohmic | $4 \times 10^{-2}$ |
| Ta | Vacuum evap. | Ohmic | $1 \times 10^{-1}$ |
| $TaB_2$ | Sputtering | Ohmic | $8 \times 10^{-2}$ |
| TaC | Sputtering | Ohmic | $1 \times 10^{-1}$ |
| TaN | Sputtering | Ohmic | $9 \times 10^{-2}$ |
| $TaS_2$ | Sputtering | Ohmic | $3 \times 10^{-2}$ |
| $TaSi_2$ | Sputtering | Ohmic | $4 \times 10^{-2}$ |

As seen in Table 7, Group IVB family metals such as V, Nb, Ta, VC, $Nb_3Al$, etc. and alloys containing a Group IVB family metal were formed, as the electrodes, on an n-type cubic boron nitride, so that the ohmic characteristic could be obtained although the contact resistance was a value within a range from $10^{-2}$ to $10^{-1}$ $\Omega.cm^2$.

It is effective to perform suitable annealing after formation of electrodes with the metals used in the above examples 1-5. Although the optimum values of the annealing temperature and time vary depending on the electrode material to be used, it is preferable to select the annealing temperature to be about 300° C.–1800° C.

Since oxidation of the electrode may progress at the time of annealing depending on the electrode material, it is desirable to perform the annealing in an inert gas, $N_2$ or $H_2$, or in a vacuum. Further, in the case where the temperature is as high as 1000° C. or more, it is preferable to perform annealing in an inert gas, $N_2$ or $H_2$, or in a vacuum, similarly to the above case, because of the oxidization or hexagonal boron-nitriding of the cubic boron nitride progresses when $O_2$ is present.

Moreover, it is more effective to use a high temperature at the time of formation of the electrodes in place of annealing. It is desirable to select this temperature to be 300° C.–1800° C, although it depends on the electrode material. It is also more effective that a metal alloy of known dopant (Si, S, or the like) and a Group IVB family element (Ti, Zr, or Hf) is formed, as the electrodes, on the n-type semiconductor cubic boron nitride. Moreover, if the electrodes according to the present invention and metal electrodes coated with Au, Ag, or the like having low resistance, are laminated to be a multilayer structure, the effect becomes more remarkable.

As described above, a Group IVB family metal (Ti, Zr, or Hf) or an alloy containing a Group IVB family metal; a metal or an alloy containing Si or S; a metal or alloy consisting of at least one of B, Al, Ga and In; or a Group VB family metal or an alloy containing a Group VB family metal is formed, as an electrode, on an n-type semiconductor cubic boron nitride, so that an ohmic contact can be obtained with respect to the n-type semiconductor boron nitride.

Since this technique is indispensable to produce semiconductor cubic boron nitride devices, it is effective in formation of all kinds of devices.

What is claimed is:

1. A method of forming an ohmic electrode comprising coating an n-type cubic boron nitride with at least one layer of a material selected from the group consisting of: a Group IVB metal; an alloy with a Group IVB metal; a metal with Si or S; an alloy with Si or S; a metal with B, Al, Ga, or In; an alloy with B, Al, Ga or In; a Group VB metal; and an alloy with a Group VB metal at a substrate temperature from 300° C. to 1800° C. by vacuum evaporation, sputtering or alloying.

2. A method of forming an ohmic contact electrode according to claim 1 wherein the coating step is at a substrate temperature of substantially 400° C. and the coating step is followed by an annealing step wherein the electrode is heated from 300° C. to 1800° C. in an atmosphere comprising an inert gas, $N_2$, $H_2$, or a vacuum.

3. A method of forming an ohmic contact electrode according to claim 1, wherein, after the coating step the n-type cubic boron nitride is coated with at least one layer of a metal selected from the group consisting of Au and Ag.

4. A method of forming an ohmic electrode comprising coating an Si-doped n-type cubic boron nitride with at least one layer of a material selected from the group consisting of: a Group IVB metal; and alloy with a Group IVB metal; a metal with Si or S; an alloy with Si or S; a metal with B, Al, Ga, or In; an alloy within, Al, Ga or In; a Group VB metal; and an alloy with a Group VB metal at a substrate temperature from 100° C. to 1800° C. by vacuum evaporation, sputtering or alloying.

* * * * *